(12) United States Patent
Takashi et al.

(10) Patent No.: US 9,004,349 B2
(45) Date of Patent: Apr. 14, 2015

(54) IC CARD AND IC CARD SYSTEM HAVING SUSPEND/RESUME FUNCTIONS

(71) Applicant: Samsung Electronics Co., Ltd., Suwon-Si, Gyeonggi-do (KR)

(72) Inventors: Kikuchi Takashi, Seoul (KR); Joong-Chul Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/493,585

(22) Filed: Sep. 23, 2014

(65) Prior Publication Data

US 2015/0012672 A1    Jan. 8, 2015

Related U.S. Application Data

(63) Continuation of application No. 14/096,040, filed on Dec. 4, 2013, now Pat. No. 8,870,062, and a continuation of application No. 11/016,317, filed on Dec. 20, 2004, now Pat. No. 8,616,437.

(30) Foreign Application Priority Data

Aug. 9, 2004 (KR) .................. 2004-62430

(51) Int. Cl.
*G06F 17/00* (2006.01)
*G06F 3/06* (2006.01)
*G06F 3/08* (2006.01)
*G06F 13/12* (2006.01)
*G06F 13/24* (2006.01)
(Continued)

(52) U.S. Cl.
CPC .............. *G06F 13/24* (2013.01); *G06F 3/061* (2013.01); *G06F 3/0613* (2013.01); *G06F 3/0659* (2013.01); *G06F 3/067* (2013.01); *G06F 3/0679* (2013.01); *G06F 3/08* (2013.01); *G06F 13/126* (2013.01); *G06F 2003/0692* (2013.01); *G06F 2213/2412* (2013.01); *G06K 7/0008* (2013.01); *G06K 19/07* (2013.01); *G11C 11/40615* (2013.01); *G11C 16/102* (2013.01)

(58) Field of Classification Search
USPC .......... 235/375, 380, 492, 439, 441; 710/305, 710/301
See application file for complete search history.

(56) References Cited

U.S. PATENT DOCUMENTS

| 5,635,703 A | 6/1997 | Tanaka |
| 5,671,374 A | 9/1997 | Postman et al. |

(Continued)

FOREIGN PATENT DOCUMENTS

| GE | DE69525732 T2 | 3/1995 |
| JP | 09-114678 | 5/1997 |

(Continued)

OTHER PUBLICATIONS

German Office Action Dated Dec. 23, 2014 in Related German Application 10 2005 036 658.1.

*Primary Examiner* — Karl D Frech
(74) *Attorney, Agent, or Firm* — Volentine & Whitt, PLLC

(57) ABSTRACT

An IC card and an IC card system are disclosed in which command processing performance is improved by storing current state data related to a first command upon interruption of an execution cycle for the first command by a second command. Upon completion of the second command, the current state information is reloaded and execution of the first command is resumed.

20 Claims, 8 Drawing Sheets

(51) Int. Cl.
  *G06K 7/00* (2006.01)
  *G06K 19/07* (2006.01)
  *G11C 11/406* (2006.01)
  *G11C 16/10* (2006.01)

(56) References Cited

U.S. PATENT DOCUMENTS

| | | |
|---|---|---|
| 6,941,402 B2 | 9/2005 | Tashiro |
| 7,017,810 B2 | 3/2006 | Bando |
| 7,055,752 B2 | 6/2006 | Yoshimoto et al. |
| 8,616,437 B2 * | 12/2013 | Takashi et al. ............... 235/375 |
| 8,870,062 B2 * | 10/2014 | Takashi et al. ............... 235/375 |
| 2002/0104890 A1 | 8/2002 | Yoshimoto et al. |
| 2003/0089785 A1 | 5/2003 | Tashiro |
| 2004/0195313 A1 | 10/2004 | Lee |
| 2005/0044377 A1 | 2/2005 | Huang |
| 2005/0077355 A1 | 4/2005 | Yamamoto et al. |
| 2005/0116050 A1 | 6/2005 | Jei et al. |
| 2006/0027644 A1 | 2/2006 | Takashi et al. |

FOREIGN PATENT DOCUMENTS

| | | |
|---|---|---|
| JP | 2002-24790 A | 1/2002 |
| KR | 2000-0033771 | 6/2000 |
| WO | 01/04743 A2 | 1/2001 |
| WO | 03/058447 A2 | 7/2003 |

* cited by examiner

| RE | SE | Function |
|----|----|----------|
| 0 | 0 | Reset |
| 0 | 1 | Suspend Execute |
| 1 | 0 | Resume Execute |
| 1 | 1 | Reserved |

| RB | SB | Function |
|----|----|----------|
| 0 | 0 | Reset |
| 0 | 1 | Suspend Busy |
| 1 | 0 | Resume Busy |
| 1 | 1 | Reserved | ated Aug. 9, 2004, the contents of which are
IC CARD AND IC CARD SYSTEM HAVING SUSPEND/RESUME FUNCTIONS

CROSS-REFERENCE TO RELATED APPLICATIONS

This is a Continuation of U.S. application Ser. No. 14/096,040, filed Dec. 4, 2013, which is a Continuation of U.S. application Ser. No. 11/016,317, filed Dec. 20, 2004, and issued as U.S. Pat. No. 8,616,437, on Dec. 31, 2013, in which a claim of priority is made to Korean Patent Application 2004-62430 filed on Aug. 9, 2004, the contents of which are hereby incorporated by reference.

BACKGROUND OF THE INVENTION

1. Field of the Invention

The present invention relates to integrated circuit (IC) cards and related systems. More particularly, the present invention relates to an IC card and an IC card system having suspend/resume functions.

2. Description of the Related Art

IC cards enjoy increasing popularity, come in a number of different form factors, and employ varying technologies to store and communicate data. So-called smart cards which use a memory circuit to store data, as opposed to conventional credit/debit cards which use a magnetic strip, are one class of IC cards. Memory cards, generally employed as a portable storage medium, are another class of IC cards. Conventional memory card includes SM (Smart Media) cards, SD (Secure Digital) cards, CF (Compact Flash) cards, XD cards, MS (Memory Stick) cards, and MMC (MultiMedia) cards.

Recent advancements in semiconductor integration technology have generally reduced the overall size of the memory devices mounted on IC cards while at the same time providing expanded storage capacity. The security features associated with the conventional IC cards are also markedly improved.

IC cards typically operate in response to a sequence of commands received from a "host device", such as a computer system, a transaction terminal, and/or a card reader. Various commands within the sequence of commands have differing importance or priority within the context of the host device/IC card interactions. For example, a host device may transmit a first command to an IC card, and immediately thereafter begin executing an operation that results in a second command to be sent to the IC card. Where the second command has a higher priority than the first command being processed by the IC card, the host device will forcibly interrupt execution of the first command, and thereafter transmit the second command to the IC card for execution. Once the second command has been executed, the host device transmits the first command to the IC card for execution.

Historically, the foregoing command sequence causes the IC to throw out or flush a number of so-called "assets" related to the first command. Assets include, data structures, data values, intermediate results, scratch pad values, temporary files, register values, data flags, variable values, and similar items that are used, defined, stored or transferred during the receipt, execution, and resolution of a command. Many, if not all, of these assets are flushed when the IC card receives the interrupt caused by the second command.

However, after the second command has been executed and the first command is again received from the host device, the IC card must begin the operations related to the first command from scratch. That is, the assets associated with the first command must be completely recreated regardless of their prior state just before the interrupt. This drawback significantly impairs the rate of command throughput for the IC card system.

SUMMARY OF THE INVENTION

The present invention is directed to an IC card and IC card system having improved performance in relation to prioritized command interrupt processing. In one embodiment of the invention provides an IC card implementing suspend/resume functions.

For example, one embodiment of the invention provides an IC card comprising a processor executing a first command, and a suspend/resume controller adapted to halt execution of the first command and store current state information upon receipt of a suspend command related to a second command.

The current state information may include assets related to the first command including a first program counter value, and in one related example the suspend/resume controller comprises a suspend table storing the first program counter value. In a still more specific example, the suspend table comprises a first-in first-out buffer.

The current state information may also include execution data from a volatile memory associated with the processor and adapted to store execution data related to the execution of the first command.

In a related embodiment, the suspend/resume controller is further adapted to reload the current state information and resume execution of the first command upon receipt of a resume command. In a specific example, the first program counter value is stored in a program counter associated with the processor upon reload of the current state information.

One embodiment of the invention provides a suspend/resume controller comprising at least one of a command register adapted to receive the suspend and the resume commands and a flag register adapted to receive suspend/resume setting bits indicative of the suspend and resume commands. In a specific example, the suspend/resume controller further comprises control logic responsive to the suspend and resume commands, and the control logic comprises at least one of a suspend/resume execute register and a suspend/resume monitoring register adapted to store reset and set bits indicative of the the suspend and resume commands.

In this regard, the suspend command may define a suspend transition period during which processor execution of the first command is halted and current state information is stored, and the resume command may define a resume transition period during which the current state information is reloaded and the processor restarts execution of the first command.

In another embodiment, the invention provides an IC card comprising; a program memory storing an application, a processor executing a first command from the application, and suspend/resume controller adapted to halt execution of the first command and store current state information upon receipt of a suspend command, and further adapted to reload the current state information and restart execution of the first command upon receipt of a resume command.

In yet another embodiment, the invention provides an IC card system comprising; host device transmitting a first command and a second command, and comprising a program memory storing at least one application related to the first and second commands, and an IC card responsive to the first and second commands. The IC card comprising a processor adapted to execute the first and second commands, and a suspend/resume controller adapted to halt execution of the first command and store current state information upon receipt of a suspend command related to the second command, and further adapted to reload the current state information and restart execution of the first command upon receipt of a resume command issued following completion of the second command.

BRIEF DESCRIPTION OF THE DRAWINGS

Several embodiments of the invention are described below with reference to the accompanying drawings. In the drawings like numerals refer to like elements in the specification. In the drawings.

DETAILED DESCRIPTION OF EXEMPLARY EMBODIMENTS

The embodiments described below with reference to the accompanying drawings are presented as teaching examples. The invention may, however, be embodied in different forms and should not be constructed as limited to only the described embodiments.

Figure 1:
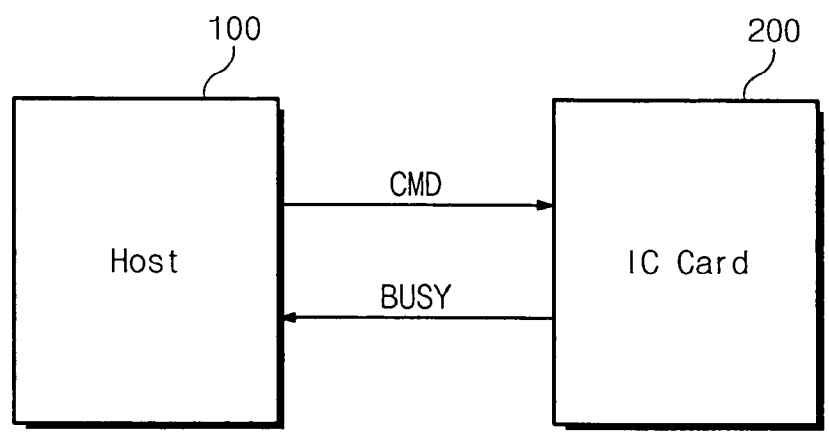
FIG. 1 is a block diagram illustrating an IC card system according to a preferred embodiment of the present invention.

FIG. 1 is a block diagram showing an IC card system according to one embodiment of the invention. The IC card system generally comprises a host device 100 and an IC card 200. IC card 200 may take one of many forms including, as selected examples, a smart card and/or a memory card. As further examples, IC card 200 may be a SM (Smart Media) card, SD (Secure Digital) card, CF (Compact Flash) card, XD card, MS (Memory Stick) card, and/or MMC (MultiMedia) card. The host device 100 may also take many specific forms, including at least a card reader, a transaction terminal, and/or a computer system.

In a general context, operation of the IC card system is characterized by the host device 100 transmitting a command (CMD) from a sequence of commands to IC card 200. IC card 200 executes the command received from host device 100, and transmits a busy signal (BUSY) to host device 100 during a time period in which IC card 200 is executing the command.

Figure 2:
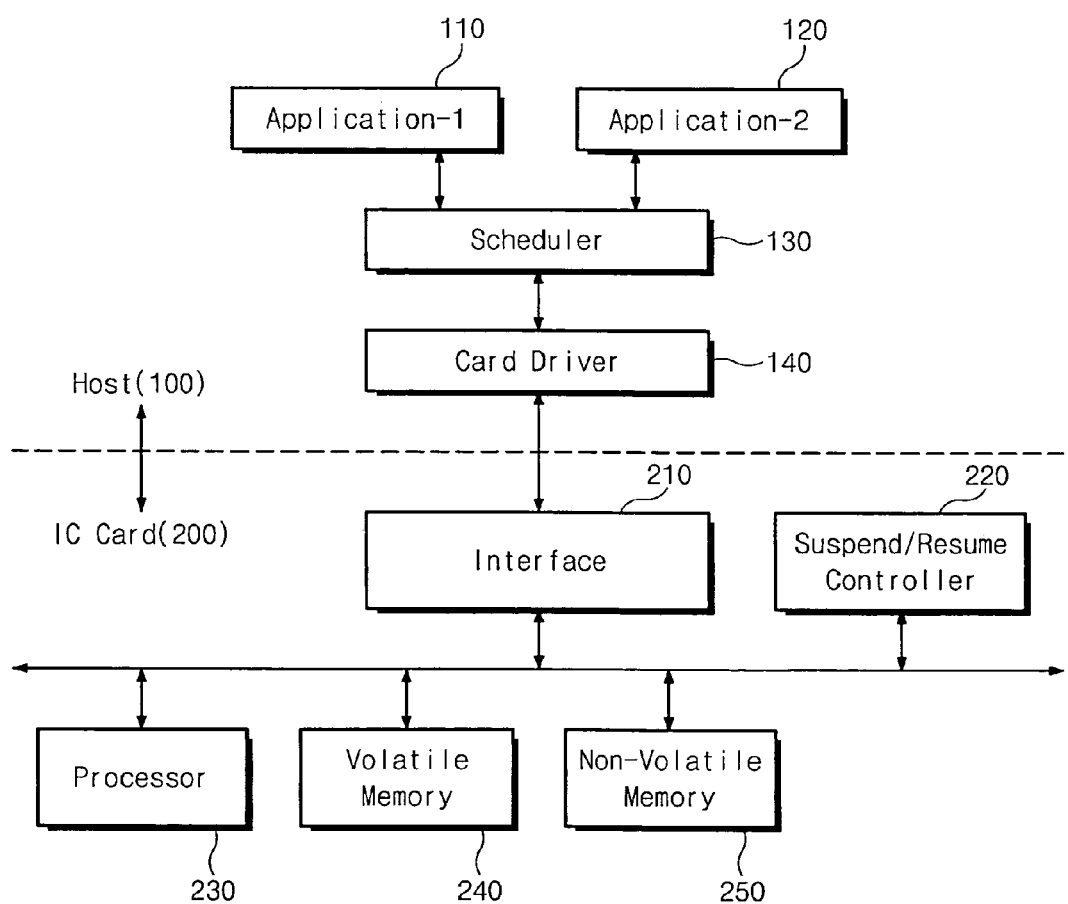
FIG. 2 is a block diagram illustrating detailed configurations of the host 100 and IC card 200 shown in FIG. 1.

FIG. 2 is a block diagram showing the IC card system of FIG. 1 in some additional detail. In the illustrated embodiment, host device 100 includes a memory (not shown) for storing one or more applications 110 and 120, and a processor (not shown) executing application 110 and 120. Commands from applications 110 and 120 to be transmitted to IC card 200 are provided to a scheduler 130. Scheduler 130 provides the commands to a card driver 140. Card driver 140 thereafter transmits the commands to an IC card interface 210. Communication (e.g., transmission and reception) of commands and/or related data between the card driver 140 and IC card interface 210 is accomplished in accordance with one or more conventionally understood protocols.

In one embodiment of the invention, IC card 200 comprises in addition to IC card interface 210, a suspend/resume controller 220, a processor 230, volatile memory 240, and non-volatile memory 250. Non-volatile memory 250 stores IC card-resident application(s) corresponding to applications 110 and 120 being run on host device 100. Non-volatile memory 250 may be configured from any type of electrically erasable and programmable read only memory (EEPROM), including as examples, flash memory, MASK ROM, M-RAM, P-RAM, and Fe-RAM. Volatile memory 240 is generally used to store the assets required for processor 230 to properly execute a command. Volatile memory 240 may be configured from dynamic random access memory (DRAM) and static random access memory (SRAM), for example.

Operation of the suspend/resume controller 220 is generally implicated in interrupt processing. That is, upon receiving an interrupt or similar command from host device 100, the execution of a current command by processor 230 is halted by suspend/resume controller 220. Further, suspend/resumes controller 220 causes the "current state information" for at least processor 230, and optionally volatile memory 240 to be stored in either non-volatile memory 250, volatile memory 240, and/or another memory device, register, or table. Current state information may include assets stored in processor 230 such as commands, data, variable values, data structures, register contents, program counter values, addresses, opcodes, etc. The current state information may also include assets stored in volatile memory 240, such as execution data, i.e., data related to or generated by the execution of a current command. Execution data includes for example, intermediate computational values, variable values, flag values, temporary data values, etc.

Figure 3:
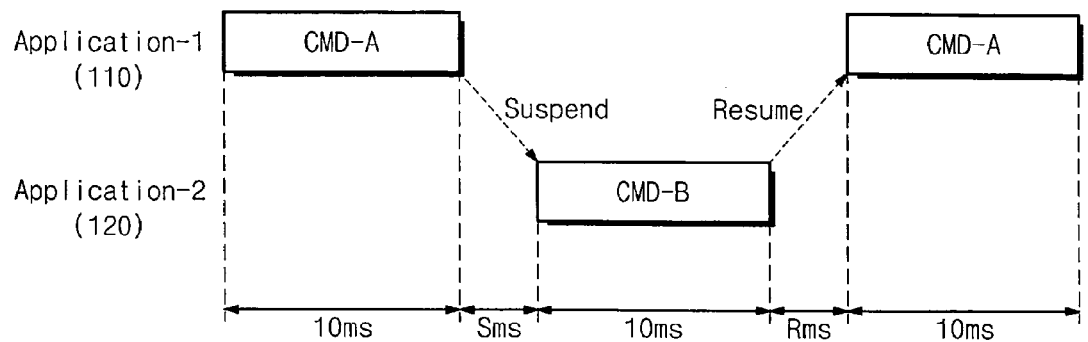
FIG. 3 is a schematic diagram illustrating suspend/resume operations in the IC card system shown in FIG. 2.

FIG. 3 schematically illustrates suspend/resume operations in the IC card system shown in FIG. 2. When a first command (CMD-A) related to first application 110 is transmitted to IC card 200, processor 230 executes it. While IC card 200 is executing first command (CMD-A), a second command (CMD-B) having a higher priority than first command (CMD-A) and related to second application 120 is placed in scheduler 130. In order to execute the second command (CMD-B) ahead of the first command (CMD-A), scheduler 130 causes host device 100 to transmit a suspend command to IC card 200 and enter a suspend preparation state.

Upon receiving the suspend command, interface device 210 of IC card 200 initiates operation of suspend/resume controller 200. Suspend/resume controller 220 then halts operation of processor 230 and stores the current state information of processor 230 and volatile memory 240. Suspend/resume controller 220 causes IC card 100 to transmit a terminate suspend preparation indication to host device 100. Upon receiving the terminate suspend preparation indication, host device 100 terminates the suspend preparation state. At this point, scheduler 130 is enabled to transmit the second command (CMD-B) to the IC card 200.

Upon receiving the second received command (CMD-B), it is executed in IC card 100 using processor 230, volatile memory 240, and non-volatile memory 250. During the period wherein processor 230 is executing the second command (CMD-B), the busy signal (BUSY) is activated. Upon completion of second command (CMD-B), the busy signal (BUSY) is deactivated. When the busy signal (BUSY) is deactivated, scheduler 130 in host device 100 transmits a "resume" command to the IC card 200.

Upon receiving the resume command from host device 100, the interface device 210 of IC card 200 again initiates operation of suspend/resume controller 220. Suspend/resume controller 220 reloads the first command (CMD-A) current state information to volatile memory 240 and memories and/or registers associated with processor 230. Within processor 230 execution of first command (CMD-A) is then restarted. In this manner, processor 230 resumes execution of first command (CMD-A) from the point at which its former execution was halted.

As illustrated in FIG. 3, assuming it takes about 20 ms to execute first command (CMD-A) and about 10 ms to execute second command (CMD-B), the total time (T) required to execute first command (CMD-A), interrupts its execution, execute second command (CMD-B) and then return and complete the execution of first command (CMD-A) may be expressed as: $T=[(20-X)+S+10+R+X]$ ms, where X is the residual time required for the execution of first command (CMD-A) as measured from the moment of interrupt, S is a time required to suspend operation of processor 230 in the execution of first command (CMD-A), and R is a time required to resume execution of first command (CMD-A).

From the foregoing equation, it can be seen that the invention offers a worst case scenario (e.g., a longest total execution time) of (30+S+R) ms. In contrast the conventional IC card system offer a worst case scenario of (almost 50+S+R) where the first command (CMD-A) is halted just before its completion.

Figure 4:
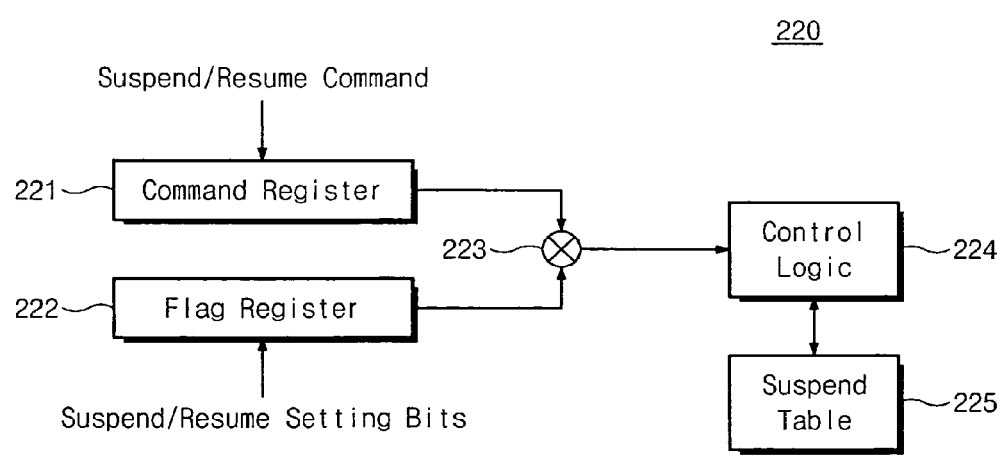
FIG. 4 is a block diagram illustrating a detailed structure of the suspend/resume controller 220 shown in FIG. 2.

FIG. 4 is a block diagram showing the suspend/resume controller 220 of FIG. 2 in some additional detail. With reference to FIG. 2, one embodiment of suspend/resume controller 220 includes a command register 221, a flag register 222, a mixer 223, control logic 224, and a suspend table 225.

Host device 100 and IC card 200 may use one or more suspend/resume command combinations to effect the foregoing. The exact nature of these command combinations is a matter of design choice, but two examples are presented here. One example is a hexadecimal encoded command, and the other example is a flag setting bit command. In the embodiment of the invention shown in FIG. 4, IC card 200 comprises both command register 221 and flag register 222. Ether of these registers may be used to receive and process a suspend command from host device 100.

The suspend/resume commands transmitted from host device 100 are provided to suspend/resume controller 220 through IC card interface 210. Command register 221 is adapted to store hexadecimal encoded suspend/resume commands received from host device 100, and flag register 222 is adapted to store flag setting bit suspend/resume commands from host device 100.

When one or more suspend/resume commands are stored in either one of the command register 221 and flag register 222, mixer 223 provides a control signal to control logic 224 which enables control logic 224 to begin suspend/resume operations.

Control logic 224 stores the current state of processor 230 and volatile memory 240. Processor 230 references among other assets, a program counter (not shown) and state registers storing addresses associated with non-volatile memory 250. Where a suspend command is received in IC card 200 during the execution of first command (CMD-A), control logic 224 identifies assets associated with the execution of first command (CMD-A) and temporarily stores them in non-volatile memory 250, volatile memory 240, or some other location—such as suspend table 225. For example, the stored assets generally include a current program counter value stored in one embodiment in suspend table 225. The current values for state registers in processor 230 are stored in one embodiment at memory location(s) having predetermined address in volatile memory 240, or some independent temporary register. All stored asset values are thus preserved during execution of second command (CMD-B) and returned to their former locations in IC card 200 following execution of the second command (CMD-B).

Figure 5:
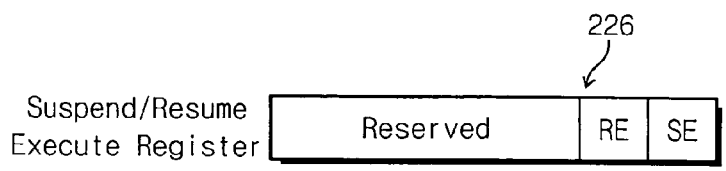
FIG. 5 shows a data structure of the flag register 222 shown in FIG. 4.

FIG. 5 shows a data structure related in one embodiment to a suspend/resume execute register 226 embedded in control logic 224. 4. Suspend/resume register 226 stores the SE bit and RE bit. The RE bit and SE bit are reset by scheduler 130 in the host device 100. Control logic 224 initiates a suspend mode when the SE bit is set to '1', whereas control logic 224 enters a resume mode when the RE bit is set to '1'.

Figure 6:
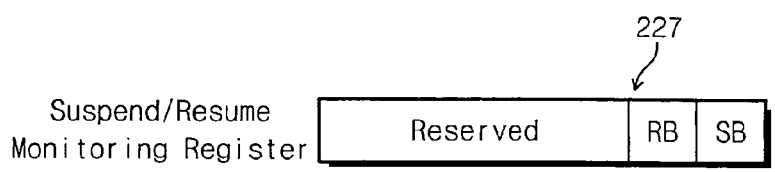
FIG. 6 is a data structure of a suspend/resume monitoring register 227 embedded in the control logic 227.

FIG. 6 shows a data structure related in one embodiment to a suspend/resume monitoring register 227 embedded in control logic 224. The suspend/resumed monitoring register 227 stores the SB bit and RB bit indicative of a suspend/resume execution section of control logic 224. In response to a suspend command, control logic 224 causes processor 230 to halt execution of the current command, store the current state, and set the SB bit to "1" during a suspend transition period of "S" ms in duration. Responsive to a resume command, during a resume transition period of "R" ms in duration control logic 224 causes processor 230 to resume execution of the halted command, and set the RB bit to "1".

When the suspend/resume transition period is terminated, both of the RB bit and the RS bit are reset to '0'. After scheduler 130 of host device 100 transmits a suspend command to IC card 200, it transmits the second command (CMD-B) when the SB bit stored in the suspend/resume monitoring register 227 is reset to '0'. Moreover, after scheduler 130 transmits a resume command to IC card 200, it transmits the first command CMD-A when the RB bit stored in the suspend/resume monitoring register 227 is reset to '0'.

Figure 7:
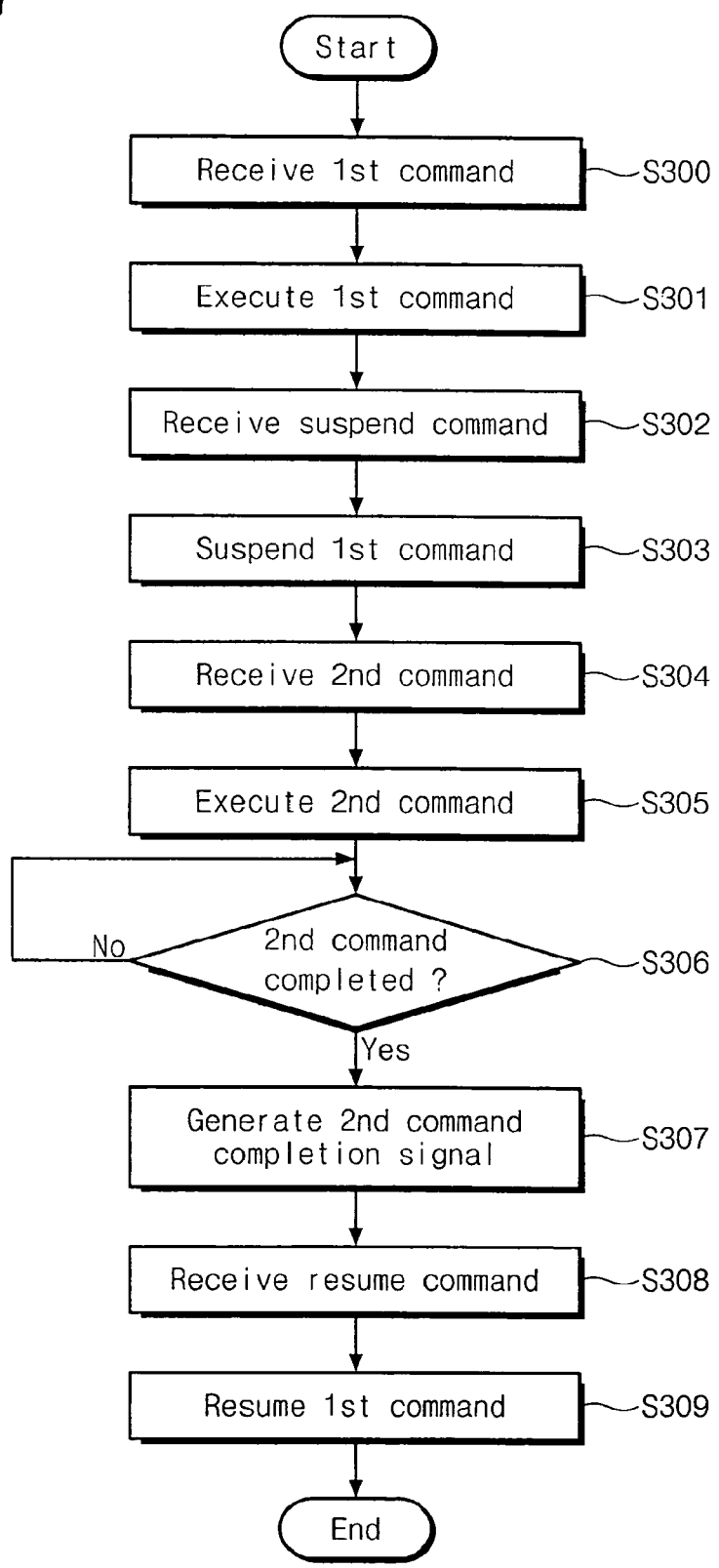
FIG. 7 is a flow chart showing a command execution sequence of an IC card 200.

FIG. 7 is a flow chart showing an exemplary command execution sequence for IC card 200. When IC card 200 receives the first command from host device 100 through IC card interface device 210 (step S300), IC card 200 executes the first command using processor 230 (step S301). A busy signal is activated. While processor 230 is executing the first command, when a suspend command is received (step S302), suspend/resume controller 220 sets the SB bit in suspend/resume monitoring register 227 to '1', and halts (e.g., suspends) execution of the first command (step S303). The busy signal is deactivated. When the suspend function is over, the SB bit in the suspend/resume monitoring register 227 is reset to '0'. As the SB bit of the suspend/resume monitoring register 227 is reset to '0', the second command is received from host device 100 (step S304). Processor 230 executes the second command (step S305). The busy signal is activated. When the execution of the second command is completed (step S306), the busy signal is activated. Namely, a second command completion signal is outputted (step S307). As the busy signal is deactivated, a resume command is received from host device 100 (step S308). Suspend/resume controller 220 sets the RB bit in the suspend/resume monitoring register 227 to '1', and initiates a resume function relative to the first command (step S309). Subsequently, remaining portion of the first command are executed.

As described above, an IC card 200 designed in accordance with the dictates of the invention, as taught by the foregoing embodiments includes suspend/resume functions capable of improving of a command processing performance.

Figure 8:
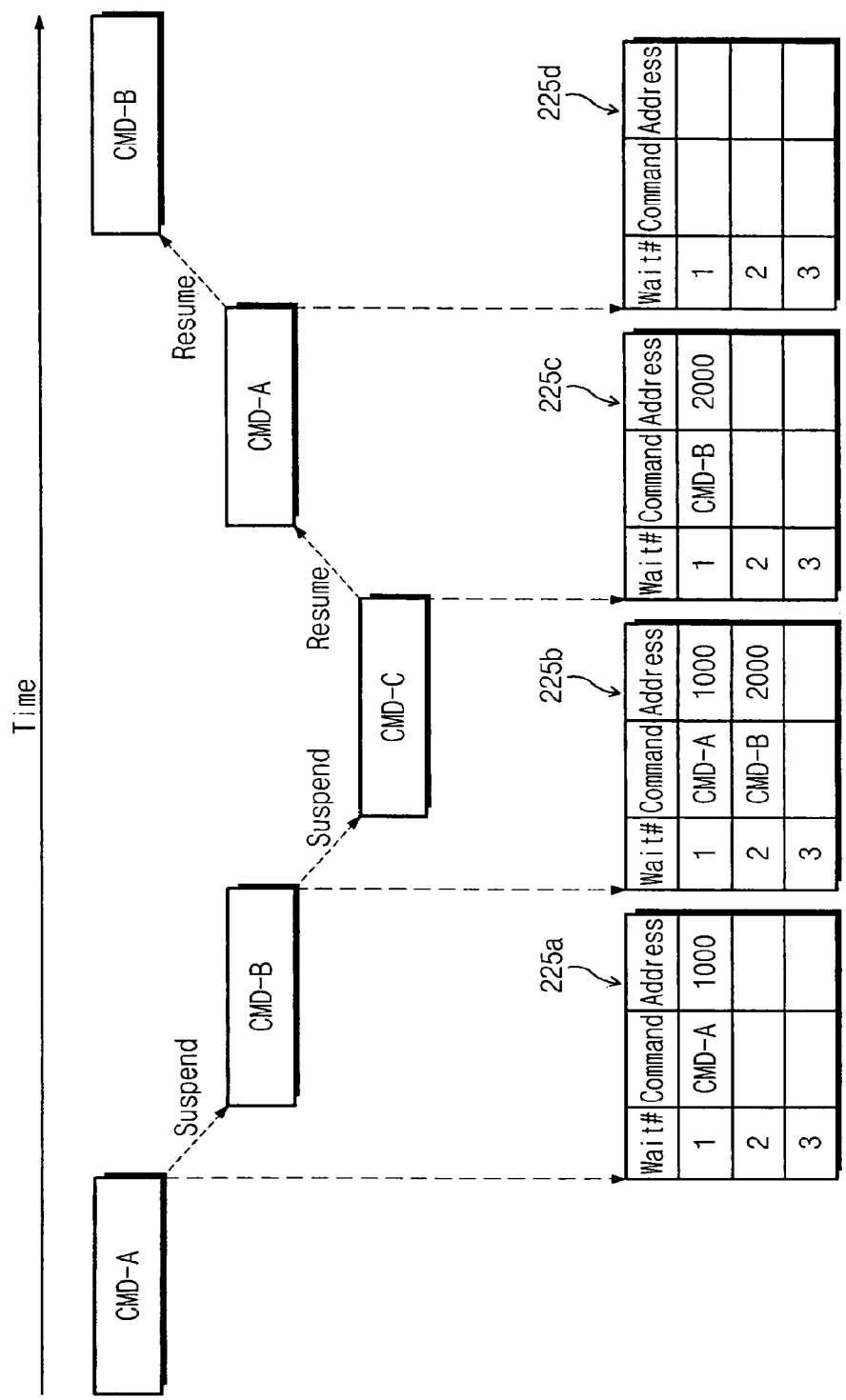
FIG. 8 is a schematic diagram illustrating an example of a suspend table 225 for storing a suspend command.

FIG. 8 shows an example of an operation using suspend table 225 to store address values (e.g., program counter values) associated with suspended commands. Where a first suspend command related to an interrupting second command (CMD-B) is received during execution of a first command (CMD-A) by IC card 200, the execution of first command (CMD-A) is halted and a related program counter value 1000 is stored as a first entry in suspend table. (See, 225a).

Then during execution of the second command (CMD-B) by IC card 200 a second suspend command related to an interrupting third command (CMD-C) is received, and the execution of the second command (CMD-B) is halted and a second program counter value 2000 is stored as a second entry in suspend table 225. (See, 225b).

Once execution of third command (CMD-C) is completed, the first command (CMD-A) is resumed and the first entry in suspend table 225 is removed (See, 225c). In similarly manner, once the execution of the first command (CMD-A) is completed, the second command (CMD-B) is resumed, and the second entry in suspend table 225 is removed (See, 225d).

Thus, in the illustrated embodiment of FIG. 8, suspend table 225 functions as a First-In, First-Out (FIFO) buffer. However, other register or memory types may be used to implement suspend table 225.

Figure 9:
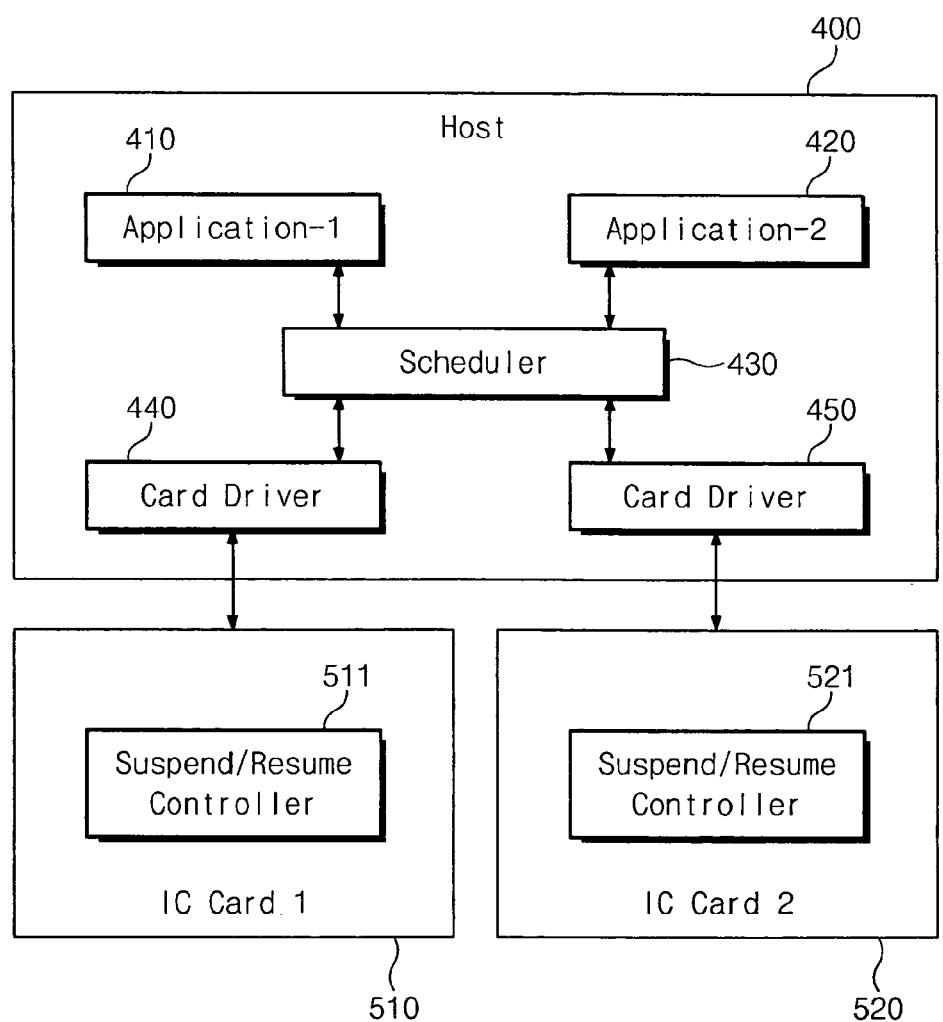
FIG. 9 is a block diagram illustrating an IC card system in which two IC cards 510 and 520 are connected to one host 400, according to another embodiment of the present invention.

FIG. 9 is a block diagram showing another embodiment of a IC card system in which two IC cards 510 and 520 are connected to one host device 400. Host device 400 includes, for example, two card readers 440 and 405 corresponding to IC cards 510 and 520, respectively. IC cards 510 and 520 include a suspend/resume controller 511 and 521, respectively.

Figure 10:
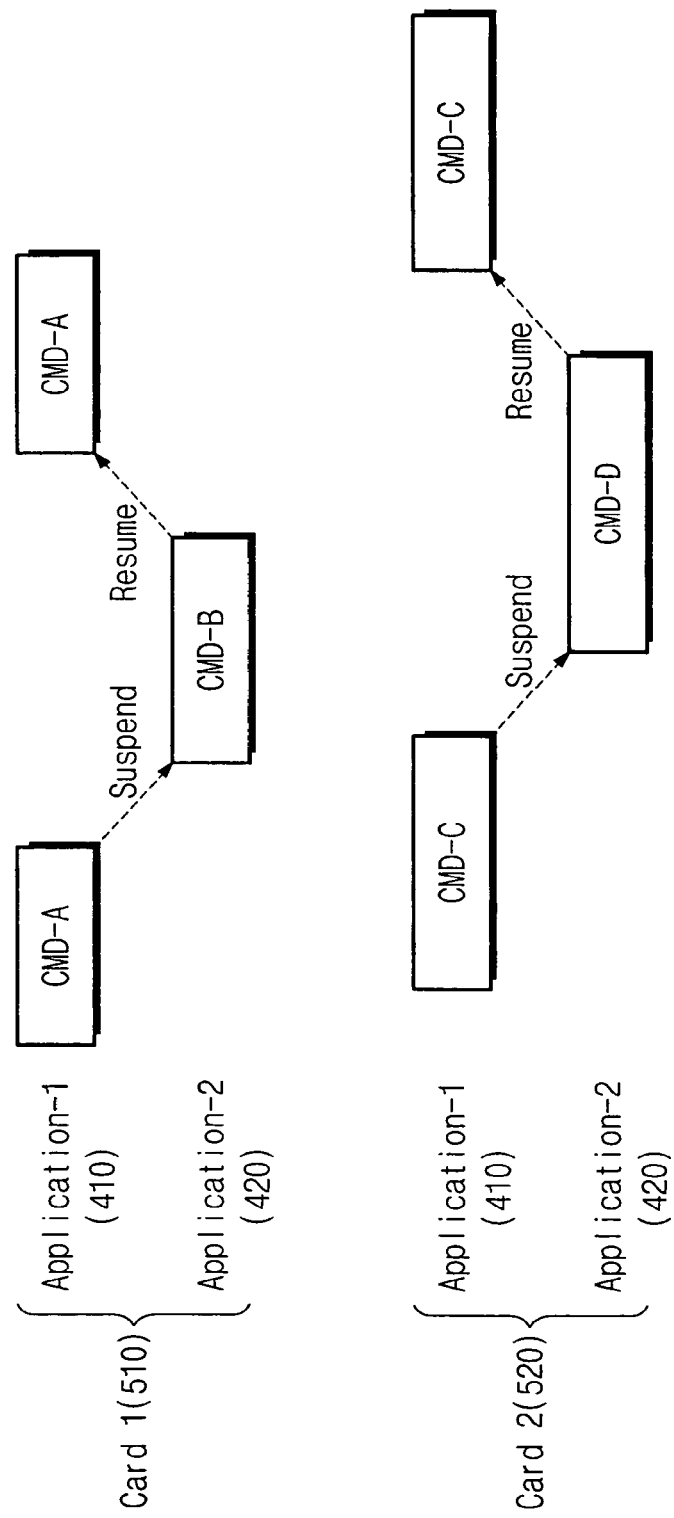
FIG. 10 is a schematic diagram illustrating a suspend/resume control sequence in the IC card system shown in FIG. 9.

FIG. 10 illustrates suspend/resume control schemes of the IC card system shown in FIG. 9. A scheduler 430 shown in FIG. 9 controls application programs 410 and 420 so that multitasking operation for the application programs 410 and 420 are performed in the IC cards 510 and 520.

The IC card system of FIG. 9 in which IC cards 510 and 520 are connected with one host device 400 is obtained by extending the principles noted above with respect to a single IC card system. That is, the suspend/resume functions described by way of the foregoing embodiments will find similar application in multi-IC card systems.

Although the present invention has been described in connection with the several embodiments, it will be apparent to those skilled in the art that various substitutions, modifications and changes may be thereto without departing from the scope of the invention which is defined by the attached claims.

What is claimed is:

1. A MultiMedia (MMC) card comprising:
a flash memory for storing data related to a program command;
a static random access memory (SRAM) configured to store flag values associated with an execution of the program command;
an interface device configured to receive the program command, a first command and an interrupt command from a host device; and
a controller configured to perform an execution of the program command in the flash memory, to halt the execution of the program command upon receiving the interrupt command, to store the flag values related to the execution of the program command at a predetermined memory location in the SRAM, to perform an execution of a first command in the flash memory upon receiving the first command, and to perform an execution of remaining portion of the program command upon again receiving the program command from the host device after completing the execution of the first command,
wherein the first command has a higher priority that was determined by the host device than the program command.

2. The MMC card of claim 1, wherein the controller performs the execution of remaining portion of the program command based on the flag values.

3. A storage medium comprising:
at least one flash memory for storing data related to a program command;
a volatile memory configured to store a state information associated with an execution of the program command; and
a controller configured to perform an execution of the program command in the at least one flash memory, to halt the execution of the program command upon receiving an interrupt or a similar command from a host device, to store the state information related to the execution of the program command at a predetermined memory location in the volatile memory, to perform an execution of a first command in the at least one flash memory upon receiving the first command from the host device, and to perform an execution of remaining portion of the program command upon again receiving the program command from the host device after completing the execution of the first command,
wherein the first command has a higher priority that was determined by the host device than the program command.

4. The storage medium of claim 3, wherein the state information includes flag values.

5. The storage medium of claim 3, wherein the state information includes data generated by the execution of the program command.

6. The storage medium of claim 5, wherein the controller performs the execution of remaining portion of the program command based on the data generated by the execution of the program command.

7. The storage medium of claim 3, wherein the volatile memory is a static random access memory (SRAM) or a dynamic random access memory (DRAM).

8. The storage medium of claim 3, further comprising an interface device configured to receive the program command and the first command from the host device.

9. The storage medium of claim 3, wherein the storage medium is a SM (Smart Media) card, a SD (Secure Digital) card, a CF (Compact Flash) card, XD card, MS (Memory Stick) a card, or a MMC (MultiMedia) card.

10. A method of operating a storage medium including at least one flash memory, the method comprising:
receiving a program command from a host device;
performing an execution of the program command in the at least one flash memory;
halting the execution of the program command upon receiving an interrupt or similar command from the host device;
storing a state information related with the execution of the program command at a predetermined memory location in a volatile memory;
receiving a first command from the host device;
performing an execution of the first command in the at least one flash memory;
receiving the program command from the host after completing the execution of the first command; and
performing an execution of remaining portion of the program command.

11. The method of claim 10, wherein the first command has a higher priority that was determined by the host device than the program command.

12. The method of claim of claim 10, wherein the state information includes flag values.

13. The method of claim of claim 10, wherein the state information includes data generated by the execution of the program command.

14. The method of claim of claim 13, wherein performing the execution of remaining portion of the program command based on the data generated by the execution of the program command.

15. The method of claim 10, wherein the volatile memory is a static random access memory (SRAM).

16. The method of claim 15, further comprising storing the state information as an entry related to the program command in a suspend table of the SRAM.

17. The method of claim 16, further comprising removing the entry in the suspend table upon completion of the execution of remaining portion of the program command.

18. The method of claim 16, wherein the storage medium is a MMC (MultiMedia) card.

19. The method of claim 10, further comprising halting performing the execution of remaining portion of the program command upon another interrupt or another similar command form the host device.

20. The method of claim 19, further storing another state information related with the execution of remaining portion of the program command at a predetermined memory location in the volatile memory.

\* \* \* \* \*